United States Patent [19]

Hiruta

[11] Patent Number: 5,179,434
[45] Date of Patent: Jan. 12, 1993

[54] SEMICONDUCTOR DEVICE AND MANUFACTURING METHOD THEREOF

[75] Inventor: Yoichi Hiruta, Matsudo, Japan
[73] Assignee: Kabushiki Kaisha Toshiba, Kawasaki, Japan
[21] Appl. No.: 752,969
[22] Filed: Aug. 29, 1991

Related U.S. Application Data

[63] Continuation of Ser. No. 454,417, Dec. 21, 1989, abandoned.

[30] Foreign Application Priority Data

Dec. 22, 1988 [JP] Japan .................. 63-324445

[51] Int. Cl.⁵ .............................. H01L 23/48
[52] U.S. Cl. ....................... 257/754; 257/904; 257/380
[58] Field of Search ............ 357/71, 65, 59, 63

[56] References Cited

U.S. PATENT DOCUMENTS 4,903,096  2/1990  Masuoka et al. ............ 357/71 P

FOREIGN PATENT DOCUMENTS 50-22879  8/1975  Japan .
63-36140  7/1988  Japan .

OTHER PUBLICATIONS

L. C. Parrillo, et al., "Twin-Tub CMOS II-An Advanced VLSI Technology", IEEE, 1982, pp. 706-709.
T. Ohzone, et al., "A. 2Kx8-Bit Static RAM", Semiconductor Research Laboratory, Matsushita Electric Industrial Co., Ltd., pp. 360-363.

Primary Examiner—Paul M. Dzierzynski
Assistant Examiner—R. A. Ratliff
Attorney, Agent, or Firm—Foley & Lardner

[57] ABSTRACT

There is disclosed a semiconductor device in which the resistance pattern on the semiconductor substrate is formed by the resistance film and the wiring pattern connected to the resistance pattern is formed by the resistance film and the conductive film deposited and formed thereon. Furthermore, a method of manufacturing such a semiconductor device by a photolithographic process is disclosed. In accordance with this method, after the resistance film is formed, a conductive film is formed thereon and the conductive film corresponding to the portion serving as a resistance element is removed. A convex portion may be provided on the insulating substrate, thus to form wiring only on this region or to form wiring only around this region.

5 Claims, 5 Drawing Sheets

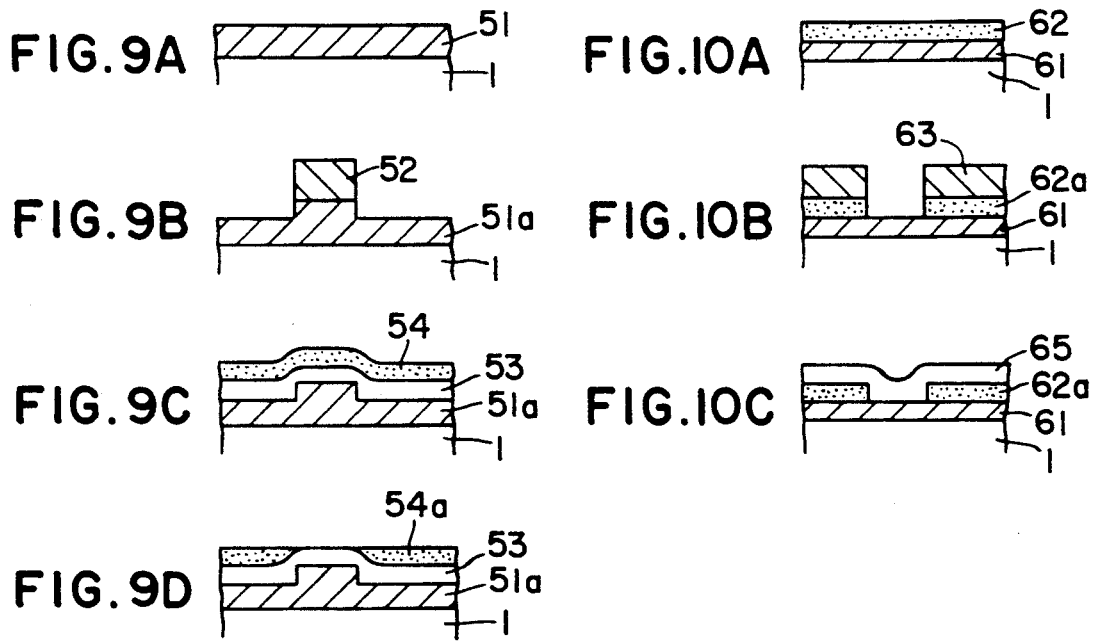
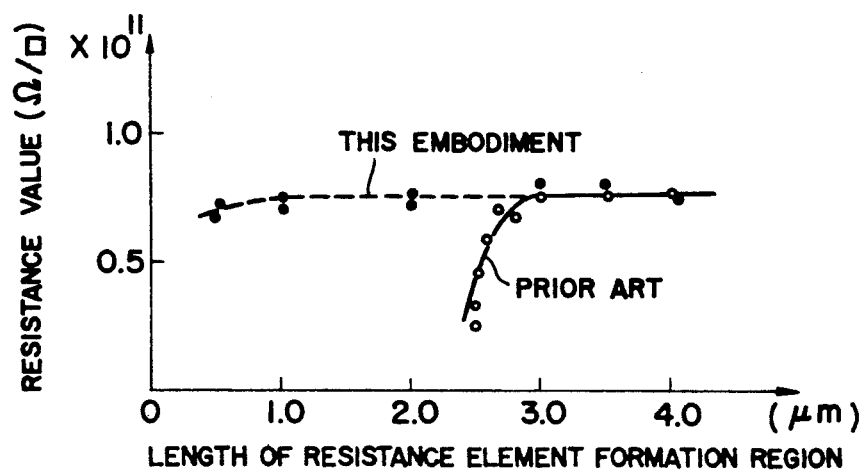
FIG. 11

SEMICONDUCTOR DEVICE AND MANUFACTURING METHOD THEREOF

This application is a continuation, of application Ser. No. 07/454,417, filed Dec. 21, 1989 now abandoned.

BACKGROUND OF THE INVENTION

This invention relates to a semiconductor device and a manufacturing method therefore.

In the circuit of a semiconductor device including a MOS transistor, as shown in FIG. 1, a resistor R103 having a relatively large resistance value is used as a circuit for protection of an input to the gate 101a of a MOS transistor Q101. This resistor R103 is formed at the layer having the same level as that of the gate 101a electrode. Namely, a gate oxide film and a field oxide film are formed on the surface of a semiconductor substrate. A polysilicon film is further deposited thereon. At the polysilicon film thus formed, the above-described resistor R103 and gate 101a are formed. In recent years, there are many instances where, in compliance with the high speed requirement of the circuit operating speed, there is employed a polycide structure comprising a refractory metal or disilicide of a refractory metal silicide such as molybdenum silicide ($MoSi_2$) or tungsten silicide ($WSi_2$), etc. deposited by sputtering on the surface of the polysilicon film, thus to form wiring in the polycide film.

However, when such a structure is employed, the layer where resistor R103 is to be formed is also of the polycide structure. As a result, the resistance value is reduced to about one tenth because of the presence of the disilicide film. In order to increase the resistance value in view of the above, the length of the resistor must be increased. However, since the length of the resistor must be increased ten times if an attempt is made to obtain the same resistance value as that in the prior art, such an implementation is practically impossible, thus failing to provide a sufficient protection function.

The high resistance requirement also exists in the semiconductor device including an enhancement type static RAM (E/R type SRAM). In the E/R type SRAM constructed as a flip-flop using MOS FETQ121 and Q122 as shown in FIG. 2, it is required that resistors R123, R124 connected to the drains of the transistors Q121, Q122 have high resistance values, respectively. To form these resistors R123, R124, there is employed a method comprising the steps of depositing an interlayer insulating film and a polysilicon film in the recited order on the surface of the semiconductor substrate, and patterning the polysilicon film by photolithographic or photoetching to form wiring. The method further includes the steps of leaving the resist film only in the area where resistor R123 or R124 is to be formed, and ion-implanting, e.g., arsenic (As) as an impurity using this resist film as an ion implantation mask, thus allowing the region corresponding to the portion except for the resistance region of the polysilicon film to have a low resistance. Resistors R123, R124 are formed with the polysilicon in the undoped resistance region as a high resistance region. However, the drawbacks with this method are as follows.

At an step of ion-implanting the impurity such as arsenic, etc., heat treatment is conducted in order to activate this impurity. Since the impurity is diffused into the high resistance region by about 0.5 to 1.0 $\mu$m, it is difficult to form a fine high resistance region with good controllability. Particularly, when the length of the high resistance region is below 3 $\mu$m as shown in FIG. 11, the impurity is diffused, so both ends thereof are in a short-circuit state. As a result, the resistance value is lowered, failing to perform the role of the resistance element.

As stated above, the problem with conventional semiconductor devices including MOS transistors is that, in forming a resistance element for the protection of an input in the same layer as that forming the gate electrode, a resistance element having a sufficient resistance value cannot be practically formed when the resistance element is constructed as the polycide structure, thereby failing to perform the role of the protective circuit. A further problem with conventional semiconductor devices including E/R type SRAM is that it is difficult to form a fine region having a high resistance value with good controllability in forming the resistor connected to the drain in the same layer as that forming the wiring portion.

SUMMARY OF THE INVENTION

An object of this invention is to provide a method of manufacturing a semiconductor device including MOS transistors, and which is capable of forming a region having a high resistance value for forming a resistance element for the protection of the input, and is capable of performing a high speed circuit operation; a method of manufacturing a semiconductor device including E/R type SRAM, which is capable of forming a fine high resistance region for forming the resistor connected to the drain in the same layer as that forming the wiring portion with good controllability, and which is capable of performing a high speed circuit operation; and semiconductor devices manufactured by the above-mentioned methods.

In accordance with the semiconductor device according to this invention, the resistance pattern on a semiconductor substrate is formed by a resistance film, and the wiring pattern connected to the resistance pattern is formed by the resistance film and a conductive film formed thereon.

Since the film serving as the resistor and the film serving as the wiring are separately formed in such a semiconductor device, a resistance element having a resistance value necessary for the resistance element and a wiring having a sufficiently low resistance value are formed. Accordingly, where the semiconductor device includes a protective circuit of an ordinary MOS transistor or a resistor of E/R type SRAM, stability of the operation and high speed circuit operation can be attained.

Furthermore, a method of manufacturing a semiconductor device according to this invention includes the steps of forming an insulating film on a semiconductor substrate, forming a resistance film on the surface of the insulating film, forming, on the surface of the resistance film, a conductive film comprised of a material having a resistance value lower than that of the resistance film, applying patterning to the conductive film and the resistance film to form portions corresponding to the wiring and the resistance element, and removing, by a photolithographic process, a predetermined portion corresponding to the resistance element of the conductive film, to therefore expose the resistance film.

Since this method forms the resistance element and the wiring by the photolithographic process in place of the ion-implantation/diffusion, it is possible to manufacture, with extremely good controllability and stability, a semiconductor device including a resistance element and a wiring.

BRIEF DESCRIPTION OF THE DRAWINGS

In the accompanying drawings:

FIGS. 9A to 9D are diagrams showing successive process steps when viewed from the cross section of a semiconductor device according to a seventh embodiment of this invention, respectively;

FIGS. 10A to 10C are diagrams showing successive process steps when viewed from the cross section of a semiconductor device according to an eighth embodiment of this invention, respectively; and FIG. 11 is a graphical representation showing the relationship between the resistance value by the methods of manufacturing a semiconductor device according to the first to eighth embodiments of this invention and that by the conventional manufacturing method.

DESCRIPTION OF THE PREFERRED EMBODIMENTS

Preferred embodiments will now be described with reference to the attached drawings.

Initially, the first to third embodiments in the case of forming a resistance element for protection of input in the same layer as that forming the gate electrode in a semiconductor device including a MOS transistor will be described.

The diagrams of successive process steps when viewed from the cross section of a first embodiment are shown in FIGS. 3A to 3D, respectively.

Figure 1:
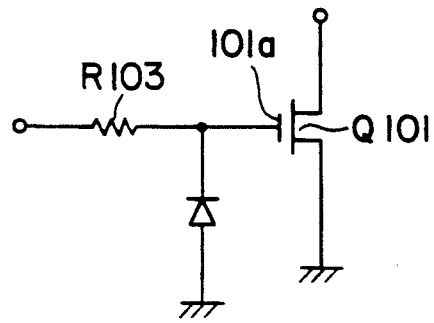
FIG. 1 is a circuit diagram of a semiconductor device to which this invention can be applied.
Figure 2:
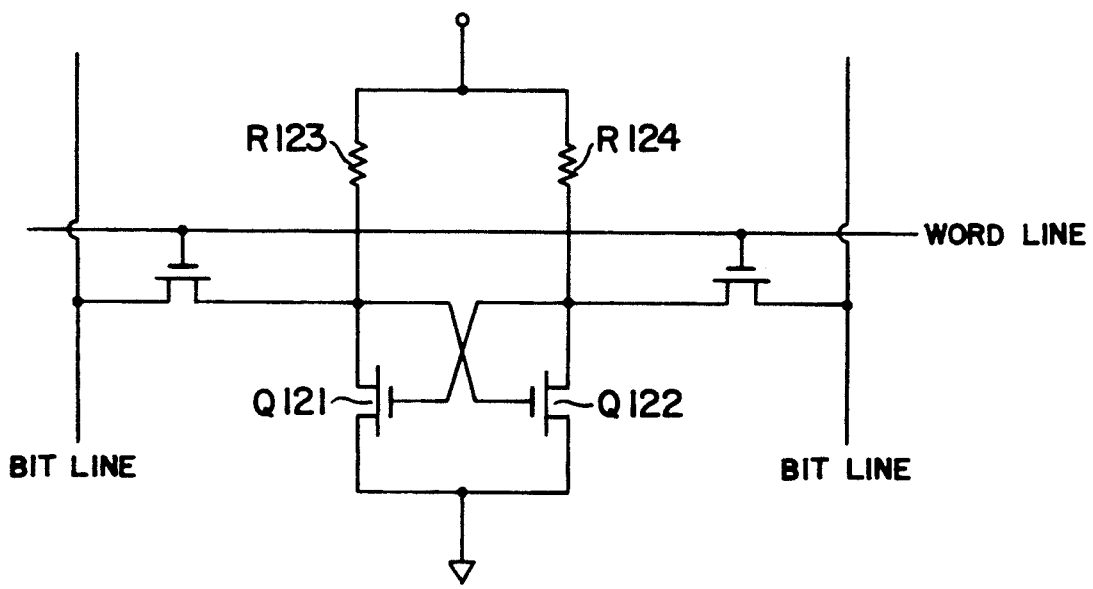
FIG. 2 is a circuit diagram of another semiconductor device to which this invention can be applied.
Figure 3A:
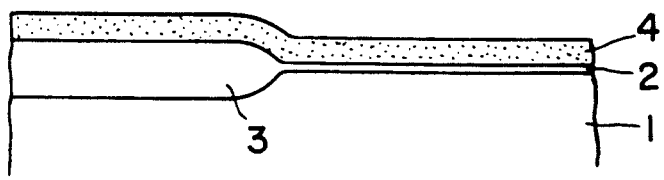
FIGS. 3A to 3D are diagrams showing successive process steps when viewed from the cross section of a semiconductor device according to a first embodiment of this invention, respectively.
Figure 3B:
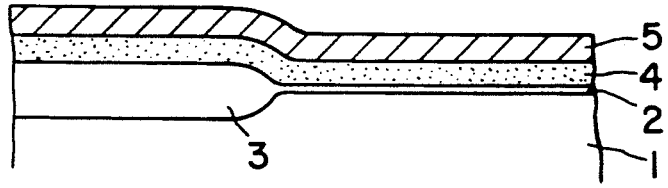

Initially, as shown in FIG. 3A, thermal oxidation is applied to the surface of a semiconductor substrate 1 to form a gate oxide film 2 having a thickness of 100 to 250 Å to selectively deposit an oxidation resisting film such as a nitride film, etc. only in a device formation region to carry out oxidation in the atmosphere of oxidation, thereby selectively forming a field oxide film 3 having a thickness of 4000 to 6000 Å only in a device isolation region. Then, polysilicon is deposited onto the entire surface by a chemical vapor deposition process (CVD process) so that its thickness is equal to about 2000 Å, thus forming a polysilicon film 4. Subsequently, as shown in FIG. 3B, disilicide such as molybdenum silicide, etc. is deposited on the polysilicon film 4 by sputtering, after the doping of impurities into the polysilicon film 4 if necessary, thus to form a disilicide film 5 having a thickness of 1500 to 2000 Å. Then, patterning is implemented to the polysilicon film 4 and the disilicide film 5 to form an electrode, a wiring and a resistance element.

Figure 3C:
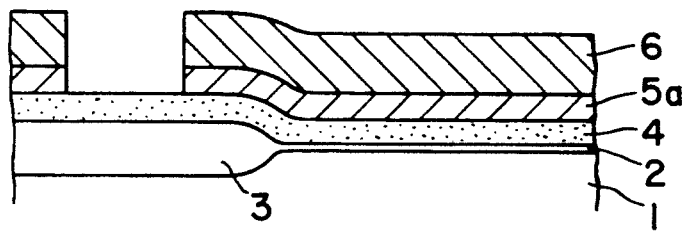
Figure 3D:
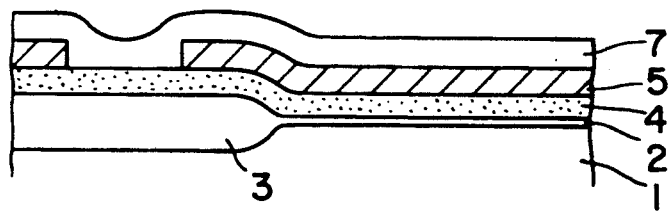

Subsequently, a resist 6 is coated on the surface of the disilicide film 5 to remove, using a photolithographic process, as shown in FIG. 3C, the disilicide film 5 in the portion corresponding to the region where a resistance element for protection of an input is to be formed to leave it as a disilicide film 5a to expose the surface of the polysilicon film 4 in a predetermined region. Thereafter, as shown in FIG. 3D, the resist film 6 may be removed to form, on the overall surface, a silicon oxide film 7 serving as an insulating film.

As a result, a current flows in the disilicide film 5a having a low resistance value at the portion where the disilicide film 5a exists, while a current flows in the polysilicon film 4 having a high resistance value at the portion where no disilicide film 5a exists. Thus, a wiring film having a low resistance and a resistance element having a high resistance are formed.

Figure 4A:
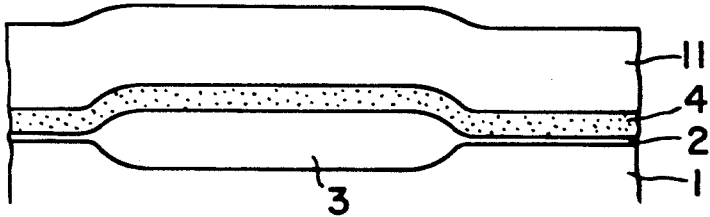
FIGS. 4A to 4C are diagrams showing successive process steps when viewed from the cross section of a semiconductor device according to a second embodiment of this invention, respectively.
Figure 4B:
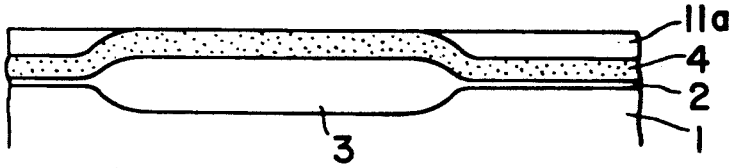
Figure 4C:
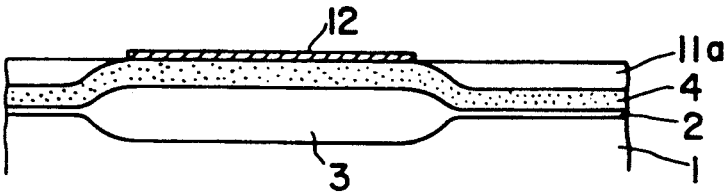

The diagrams of successive process steps when viewed from the cross section of a device according to a second embodiment are shown in FIGS. 4A to 4C, respectively. As shown in FIG. 4A, a gate oxide film 2 and a field oxide film 3 are formed on the surface of a semiconductor substrate 1. Then, a polysilicon 4 having a thickness of 4000 Å and a silicon oxide film 11 having a thickness of 4000 to 10000 Å are deposited and formed in the order recided on the gate oxide film 2 and the field oxide film 3.

Subsequently, a resist is coated on the entire surface of the silicon oxide film 11 to gradually conduct etching while carrying out a time control. As a result, as shown in FIG. 4B, the silicon oxide film 11 on the surface of the field oxide film 3 is subjected to etching back and is thus removed. The polysilicon 4 in this portion is exposed.

Then, as shown in FIG. 4C, metal such as tungsten, etc. is selectively deposited by the CVD process only on the surface of the exposed polysilicon 4 to form a conductive film 12.

Subsequently, patterning is implemented to the silicon oxide film 11 and the polysilicon film 4 therebelow, and the conductive film 12. Thus, a resistance element and a wiring are formed in the polysilicon film 4 below the silicon oxide film 11 and the conductive film 12, respectively.

The diagrams of successive process steps when viewed from the cross section of a device according to a third embodiment are shown in FIG. 5A to 5E, respectively.

Figure 5A:
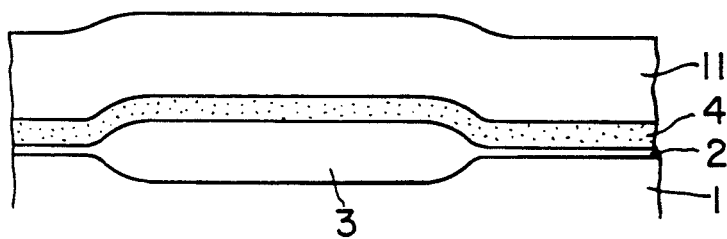
FIGS. 5A to 5E are diagrams showing successive process steps when viewed from the cross section of a semiconductor device according to a third embodiment of this invention, respectively.
Figure 5B:
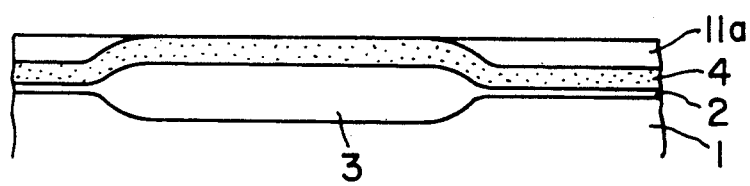
Figure 5C:
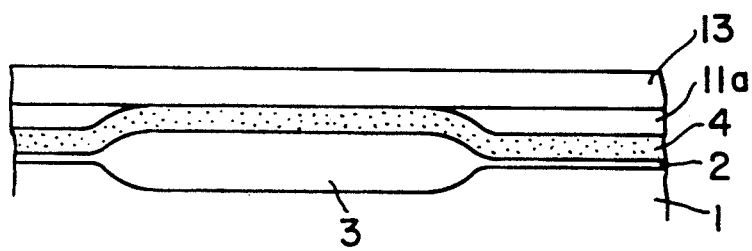
Figure 5D:
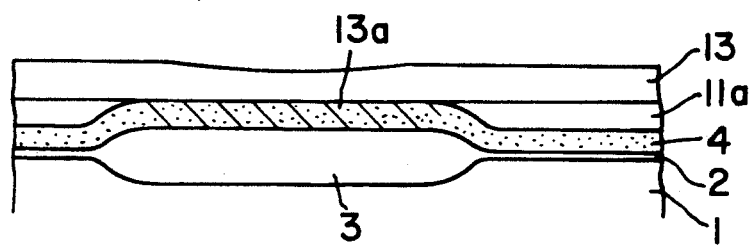
Figure 5E:
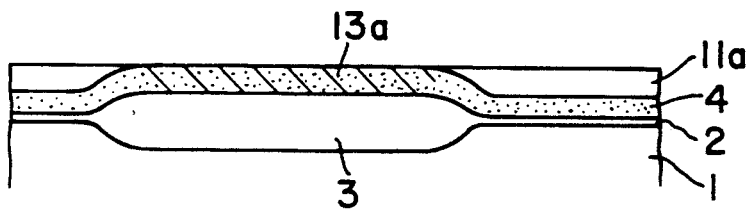

Since FIG. 5A and 5B are same as FIG. 4A and 4B, the detail description will be omitted.

After the process step of 5B, a refractory metal film 13 such as tungsten, molybdenum, etc. is deposited on the overall surface as shown in FIG. 5A.

Then, the semiconductor substrate is subjected to a heating process at the temperature of 400° C.-800° C. for 5-20 minutes, and the exposed portion shown in FIG. 5B is changed to a metal silicide 13a.

Subsequently, the refractory metal film is removed by etching using acid.

In this embodiment, the polysilicon film portion used as a conductor has a low resistivity.

Figure 6A:
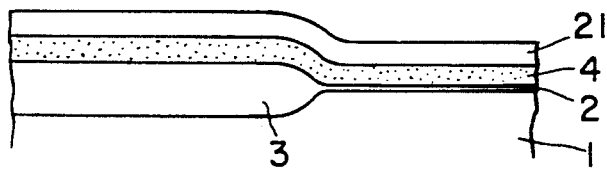
FIGS. 6A to 6C are diagrams showing successive process steps when viewed from the cross section of a semiconductor device according to a fourth embodiment of this invention, respectively.
Figure 6B:
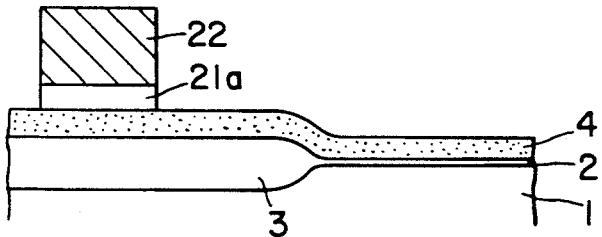
Figure 6C:
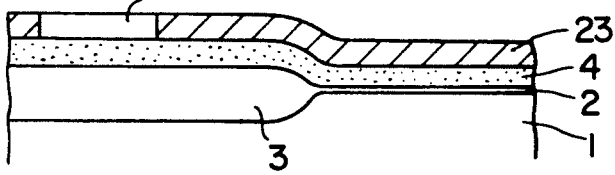

The diagrams of successive process steps when viewed from the cross section of a device according to a fourth embodiment are shown in FIGS. 6A to 6C, respectively. As shown in FIG. 6A, a polysilicon film 4 2000 Å thick is formed on the surface of a gate oxide film 2 and a field oxide film 3 formed on a semiconductor substrate 1. Furthermore, a silicon oxide film 21 having a thickness of 1500 to 2000 Å is formed thereon. Thereafter, a resist is coated on the entire surface of the silicon oxide film 21. Then, photolithographic process is used to remove other portions while leaving only the silicon oxide film 21a and the resist 22 in a predetermined region as shown in FIG. 6B.

Subsequently, the resist 22 is removed to selectively grow metal such as tungsten, etc. by the CVD process on the surface of the exposed polysilicon film 4, thus to form a conductive film 23.

Finally, a resistance element, and a wiring and a gate oxide film are formed by patterning in the polysilicon film 4 below the silicon oxide film 21a and in the conductive film 23, respectively.

As stated above, in accordance with the first to fourth embodiments, high speed circuit operation can be attained by forming wiring in the disilicide film having a low resistance value or the conductive film consisting of metal. Furthermore, a sufficient protective function can be provided by forming a resistance element for a protective circuit in the polysilicon film having a resistance value higher than that of the disilicide film or the conductive film. In addition, since the device according to the third embodiment includes a silicon oxide film 21a and conductive film 23 which are equal to each other in thickness to form a planar surface, this structure has no bad influence on the step coverage of the wiring layer stacked thereon.

The fifth to ninth embodiments in the case of the semiconductor device including the E/R type SRAM will now be described. In these embodiments, formation of the resistance element connected to the drain of the MOS FET and wiring is carried out at the same level.

Figure 7A:
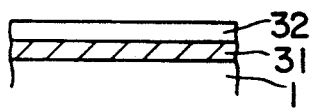
FIGS. 7A to 7D are diagrams showing successive process steps when viewed from the cross section of a semiconductor device according to a fifth embodiment of this invention, respectively.

The diagrams of successive process steps in a method of manufacturing a semiconductor device according to the fifth embodiment are shown in FIGS. 7A to 7D, respectively. As shown in FIG. 7A, a silicon oxide is deposited on the surface of a semiconductor substrate 1 by CVD process so that its thickness is equal to 2000 Å. An interlayer insulating film 31 is thereby formed. Then, polysilicon is deposited on the surface of the interlayer insulating film 31 by CVD process so that its thickness is equal to about 500 Å. A polysilicon film 32 is therefore formed.

Figure 7B:
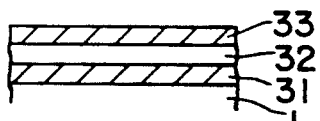

Then, as shown in FIG. 7B, a silicon oxide is deposited on the surface of the polysilicon film 32 by CVD process so that its thickness is equal to about 1000 Å. A silicon oxide film 33 is therefore formed.

Figure 7C:
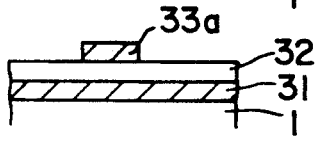

Subsequently, resist is coated on the surface of the silicon oxide film 33. As shown in FIG. 7C, other silicon oxide film 33 is removed by photolithographic process while only the silicon oxide film 33a in a predetermined region is left and the polysilicon film 32 is exposed in the region outside thereof.

Figure 7D:
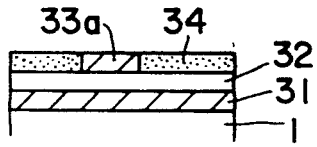

Then, as shown in FIG. 7D, metal material such as tungsten, etc. is grown by CVD process selectively only on the surface of the exposed polysilicon film 32 so that its thickness becomes equal to the same thickness as that of the silicon oxide film 33a. Thus, a conductive film 34 is formed.

Thereafter, patterning is implemented to form a resistance element in the polysilicon film 32 below the silicon oxide film 33a, and to form wiring in the conductive film 34. A semiconductor device according to this embodiment is provided by the manufacturing method as stated above. It is to be noted that while this method is similar to that of the embodiment shown in FIG. 6, the polysilicon film is not formed directly on the field oxide film as shown in FIG. 6, but is formed on the interlayer insulating film.

Figure 8A:
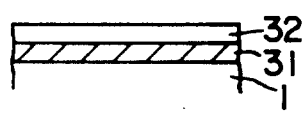
FIGS. 8A to 8D are diagrams showing successive process steps when viewed from the cross section of a semiconductor device according to a sixth embodiment of this invention, respectively.

Referring to FIGS. 8A to 8D, there is shown a sixth embodiment. Initially, as shown in FIG. 8A, polysilicon is deposited by CVD process on the surface of the interlayer insulating film 31 on a semiconductor substrate so that its thickness is equal to about 500 Å in the same manner as in the fourth embodiment. Thus, a polysilicon film 32 is formed.

Figure 8B:
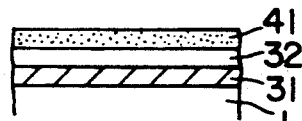

Then, as shown in FIG. 8B, disilicide such as molybdenum silicide, etc. is deposited by a sputtering process on the surface of the polysilicon film 32 so that its thickness is equal to 500 to 1000 Å. Thus, a disilicide film 41 is formed.

Figure 8C:
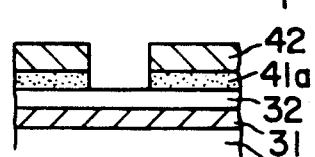

Subsequently, resist 42 is coated on the surface of the disilicide film 41 to remove only a predetermined region using a photolithographic process. Thus, the disilicide film 41a subjected to patterning is provided as shown in FIG. 8C and the surface of the polysilicon film 32 is exposed within this region.

Figure 8D:
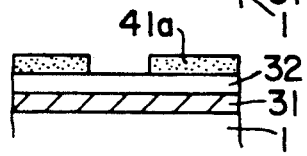

As shown in FIG. 8D, resist 42 is then removed. After that, patterning is implemented to form a resistance element in the exposed polysilicon film 32 and to form a wiring in the disilicide film 41a. While this method is similar to that of the embodiment shown in FIG. 3, the polysilicon layer is not formed directly on the field oxide film as shown in FIG. 3, and is formed on the interlayer insulating film.

A seventh embodiment will now be described. This embodiment differs from the above-described fourth and fifth embodiments in that a silicon oxide is deposited thickly on the surface of the semiconductor substrate 1 so that its thickness is equal to 4000 Å as shown in FIG. 9A. An interlayer insulating film 51 is therefore formed.

Then, resist is coated on the surface of the interlayer insulating film 51. As shown in FIG. 9B, by using anisotropic etching such as reactive ion etching so that the thickness of the interlayer insulating layer 51 except for a predetermined region for forming a resistor by photolithographic process is thinner than the thickness of the predetermined region by 500 to 1000 Å, an interlayer insulating film 51a is formed. Then, resist 52 is removed.

Subsequently, as shown in FIG. 9C, polysilicon is deposited on the surface of the interlayer insulating film 51a. A polysilicon film 53 is therefore formed. In addition, disilicide such as molybdenum silicide, etc. is deposited thereon. A disilicide film 54 is therefore formed.

Thereafter, as shown in FIG. 9D, the portion corresponding to the predetermined region where the interlayer insulating film 5 is thick of the disilicide film 54 is removed by etch back process. A disilicide film 54a is therefore formed, and the polysilicon film 53 of this portion is exposed. Patterning is then implemented. As a result, a resistor is formed in the polysilicon film 53 of the exposed portion and a wiring is formed in the disilicide film 54a.

The diagrams of successive process steps when viewed from the cross section of a device according to a seventh embodiment are shown in FIGS. 10A to 10C, respectively. Initially, as shown in FIG. 10A, an interlayer insulating film 61 is formed on a semiconductor substrate 1. Then, disilicide such as molybdenum silicide, etc. is deposited thereon by CVD process so that its thickness is equal to about 500 Å. A disilicide film 62 is therefore formed.

Then, resist is coated on the disilicide film 62. Only a predetermined region is removed by photolithographic process. A disilicide film 62a is thus formed as shown in FIG. 10B. Thereafter, resist 63 is removed.

Thereafter, polysilicon is deposited on the entire surface as shown in FIG. 10C. A polysilicon film 65 is therefore formed.

Finally, a resistance element is therefore formed in the polysilicon film 65 and a wiring is formed in the disilicide film 62a.

Conventionally, as described above, doping is conducted into a region having a high resistance value and ion-implantation is conducted into a predetermined region. Then, thermal diffusion is carried out, thereby forming a region having a low resistance value so that it is flush with a region having a high resistance value. Thus, a doped impurity is also diffused into the region except for the predetermined region. As a result, it was difficult to form a fine region having a high resistance value with good controllability. On the contrary, in accordance with manufacturing methods according to the fourth to eighth embodiments, a photolithographic process is used as described above without using the ion-implantation process and the thermal diffusion process to form respective regions. Thus, a fine region having a high resistance value can be formed with good controllability. Particularly, in the semiconductor device according to the fourth embodiment, such a fine region having a high resistance value is formed with good controllability.

A comparison between the resistance value of a region where the resistance value is to be high, formed for formation of the resistance element in the case of the first to eighth embodiments and that in the case of the conventional manufacturing method will now be made. FIG. 11 shows the length of this region with respect to changes in the resistance value. In the case of the prior art, when the length of the resistance element formation region is below 3 μm, the resistance value is abruptly lowered. On the contrary, in the case of the embodiments of this invention, the resistance value is substantially equal to a fixed value irrespective of the length of the resistance element formation region. It is seen from this fact that the embodiments according to this invention can form a fine region having a high resistance value for formation of a resistance element with good controllability.

It is a matter of course that the above-described embodiments do not limit this invention. For example, while polysilicon is used as the material having a first resistance value, other materials such as molybdenum oxide, or tungsten oxide, etc. suitable for formation of the resistance element may be used. In addition, while molybdenum silicide or metal material is used as the material having a second resistance value, other metal disilicides such as tungsten silicide, titanium silicide, or tantalum silicide, etc. may be used as long as they permit attainment of high speed circuit operation in the formation of wiring.

What is claimed is:

1. A semiconductor comprising:
   an insulating film formed on a semiconductor substrate;
      a resistance film consisting of a material having a first sheet resistance value, formed as wiring pattern portions and resistance pattern portions in interconnecting two opposing wiring pattern portions, the resistance film being formed on an upper surface of said insulating film; and
   a conductive film of a material having a second sheet resistance value which is lower than said first sheet resistance value, the conductive film being deposited and formed on an upper surface of the entire wiring pattern portions of said resistance film;
   said conductive film also being used as wirings, and said resistance film formed on said resistance pattern portions being used as resistance elements.

2. A semiconductor device as set forth in claim 1, wherein a silicon oxide film is formed on said resistance film of at least the resistance pattern portion.

3. A semiconductor device as set forth in claim 1, wherein the resistance pattern portion is provided in correspondence with a field oxide film region.

4. A semiconductor device as set forth in claim 1, wherein the resistance pattern portion is provided in correspondence with a convex or projected portion formed on the insulating film.

5. A semiconductor device as set forth in claim 1, wherein said resistance film is a polysilicon film, and said conductive film is a metal film or a metal disilicide film.

* * * * *